(12) United States Patent
Mueller et al.

(10) Patent No.: US 6,430,076 B1
(45) Date of Patent: Aug. 6, 2002

(54) MULTI-LEVEL SIGNAL LINES WITH VERTICAL TWISTS

(75) Inventors: Gerhard Mueller, Meitingen; Armin M. Reith, Munich, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/964,209

(22) Filed: Sep. 26, 2001

(51) Int. Cl.⁷ .................................................. G11C 5/02
(52) U.S. Cl. ........................................... 365/51; 365/63
(58) Field of Search ................................ 365/51, 63, 69

(56) References Cited

U.S. PATENT DOCUMENTS 6,320,780 B1 * 11/2001 Mueller et al. ............... 365/63
6,327,170 B1 * 12/2001 Mueller et al. ............... 365/69
6,188,598 B1 *  2/2002 Mueller et al. ............... 365/69

* cited by examiner

Primary Examiner—Son T. Dinh
(74) Attorney, Agent, or Firm—Stanton Braden

(57) ABSTRACT

A multi-level signal line architecture having signal line pairs employing vertical twists to reduce couplings noise is disclosed. The signal line pairs are provided with open regions to accommodate offsets of twists of adjacent signal line pairs, thus reducing the line pitch of the signal lines. The open region is formed by removing a portion of the signal line in the upper level and locating that portion on another level above the upper level.

1 Claim, 7 Drawing Sheets

MULTI-LEVEL SIGNAL LINES WITH VERTICAL TWISTS

FIELD OF THE INVENTION

The present invention relates generally to multi-level signal lines with vertical twists. In particular, the invention relates to multi-level bitline architectures in memory ICs.

BACKGROUND OF THE INVENTION

Referring to FIG. 1, a conventional dynamic random access memory cell 101 is shown. As shown, the memory cell comprises a cell transistor 110 and a cell capacitor 150 for storing information. A first junction 111 of the transistor is coupled to a bitline 125, and a second junction 112 is coupled to the capacitor 150. A gate electrode 113 of the transistor is coupled to a wordline 126. A reference or constant voltage ($V_{p1}$) can be coupled to a plate of the capacitor. The plate which is coupled to the reference voltage can serve as a common plate in the memory array.

Cells are arranged in rows and columns to form an array, connected by wordlines in the row direction and bitlines in the column direction. The bitlines are coupled to sense amplifiers to facilitate memory accesses. Typically, a pair of bitlines is coupled to a sense amplifier. The bitline containing the selected memory cell is referred to as the bitline or bitline true and the other is referred to as the reference bitline or bitline complement.

The bitlines can be arranged in various types of bitline architectures, such as open, folded, open-folded, diagonal, multi-level, split-level, or split-level diagonal. Multi-level or split-level bitline architectures are described in, for example, Hamada et al., A Split Level Diagonal Bitline Stack Capacitor Cell for 256 Mb DRAMs, IEDM 92-7990 and Hoenigschmid et al., A 0.21 $\mu$m2 7F Trench Cell With a Locally-Open Globally-Folded Dual Bitline For 1 Gb–4 Gb DRAM, VLSI Symp. 1998, which are herein incorporated by reference for all purposes.

FIG. 2 shows a multi-level bitline architecture with vertical twists. As shown, a bitline pair 210 comprises bitlines 211 and 212 which occupy upper and lower bitline levels 230 and 220. The lower bitline level is referred to as M0 and the top bitline level is referred to as M1. The bitlines are substantially vertically aligned with each other in the different bitline levels. Vertical twists 280 are provided to switch the levels of the bitlines from M0 and M1. Memory cells 250 are coupled to the bitline segments on M0.

Referring to FIG. 3, a conventional technique for realizing a vertical twist is shown. As shown, a bitline pair 310 having first and second bitlines 311 and 312 comprises a twist 280. The first bitline 311 includes a first segment 311a on M0 and a second segment 311b on M1. The second bitline 312 includes a first segment 312a on M1 and a second segment 312b on M0. The twist 280 comprises first and second contacts 340 and 350. The first contact switches the first bitline on M0 (segment 311a) to M1 (segment 311b); the second contact switches the second bitline on M1 (segment 312a) to M0 (segment 312b). A portion of bitline segments 311b and 312a is offset on opposite sides of the bitline to avoid the contact that couples the segments of the other bitline. Such conventional realizations of the twist, however, require a larger pitch or distance between adjacent bitline pairs which results in an area penalty. This is undesirable as it results in a larger chip.

As evidenced from the foregoing discussion, it is desirable to provide an improved multi-level bitline architecture which reduces the area penalty associated with the twists.

SUMMARY OF THE INVENTION

The invention relates to multi-level signal line architectures with vertical twists. The vertical twists are used to switch the signal lines of a signal line pair from one level to another (e.g., from the first level to the second level). In one embodiment, the signal line pairs are bitline pairs. The twists are arranged to reduce coupling noise between signal line pairs. In accordance with the invention, open regions are provided in a signal line pair to accommodate an offset from a twist of an adjacent signal line pair. The open region is formed by removing a portion of the signal line in the upper level or second level and locating it on third level. The use of an open region enables smaller pitch between signal line pairs. In another embodiment, the open region accommodates two offsets, one from each of the adjacent signal line pairs.

DETAILED DESCRIPTION OF THE INVENTION

The invention relates generally to multi-level signal line architectures of integrated circuits (ICs) with vertical twists. Such ICs can be, for example, random access memories (RAMs) including dynamic RAMs (DRAMs), high speed DRAMs such as Rambus DRAMs and SLDRAMs, ferroelectric RAMs (FRAMs), synchronous DRAMs (SDRAMs), merged DRAM-logic chips (embedded DRAMs), or other types of memory ICs or logic ICs. In accordance with the invention, multi-level signal lines with twists can be realized with a smaller area penalty as compared with conventional multi-level signal lines with twists. The reduction in area penalty is achieved by providing an additional metal level for the signal lines. By reducing the area penalty associated with the twists, smaller chips can be produced.

Figure 1:
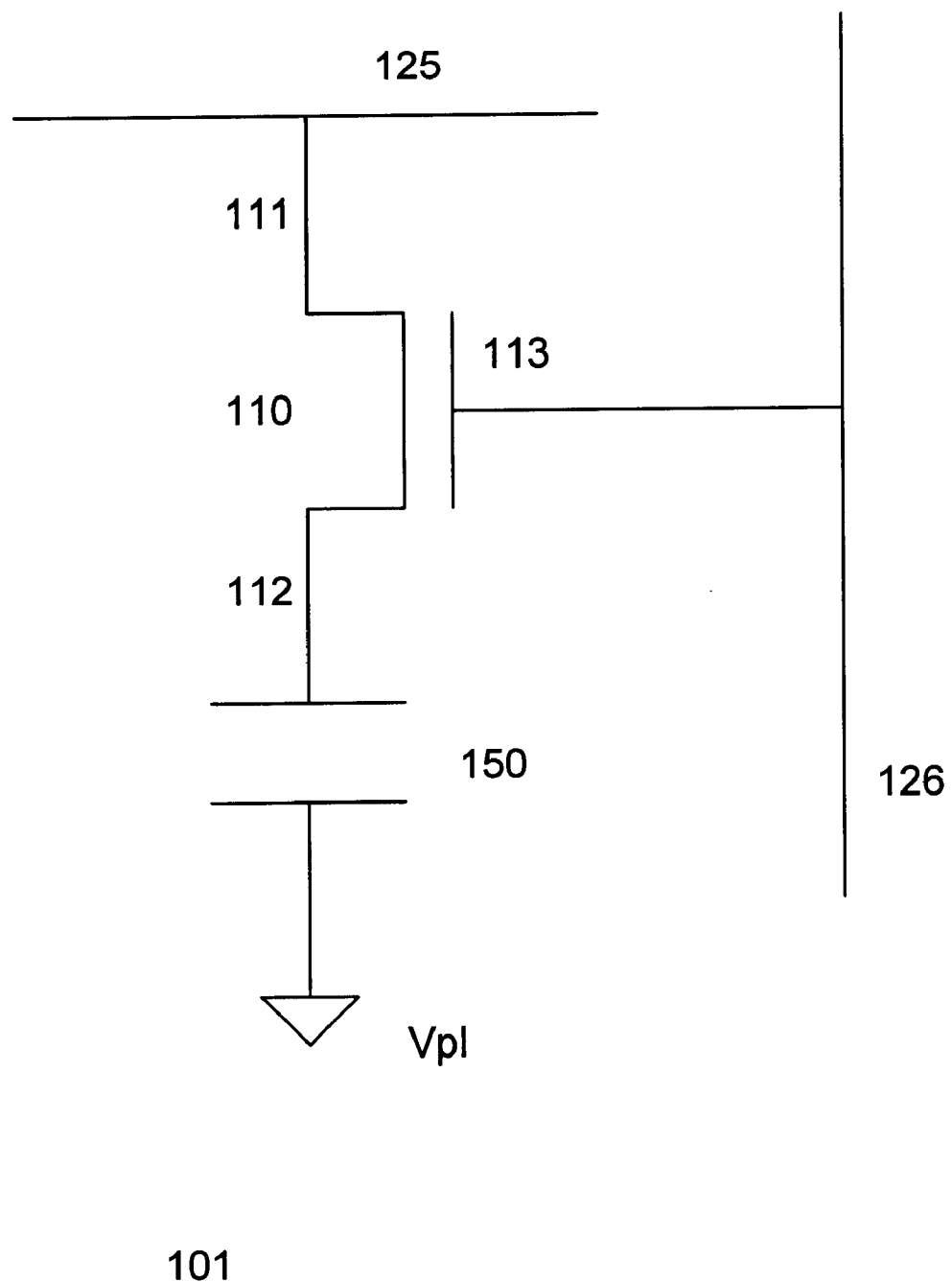
FIG. 1 shows a memory cell.
Figure 2:
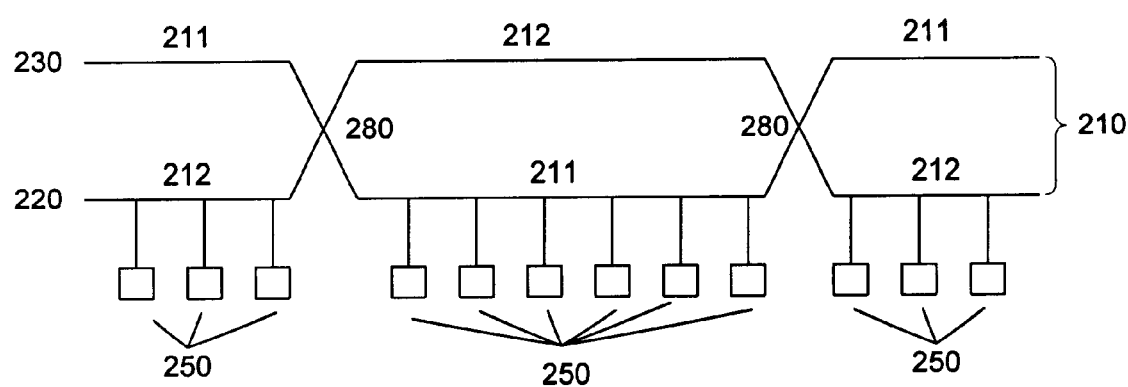
FIGS. 2–3 show a multi-level bitline architecture with vertical twists.
Figure 3:
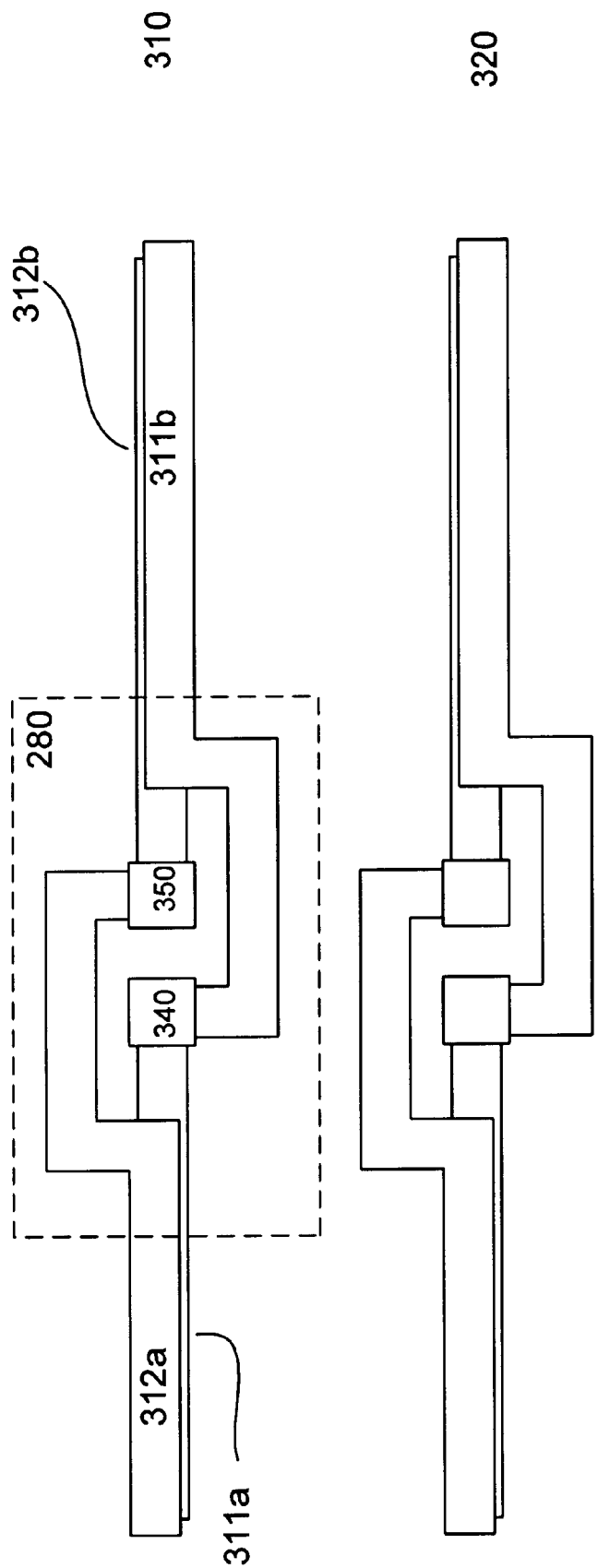
Figure 4:
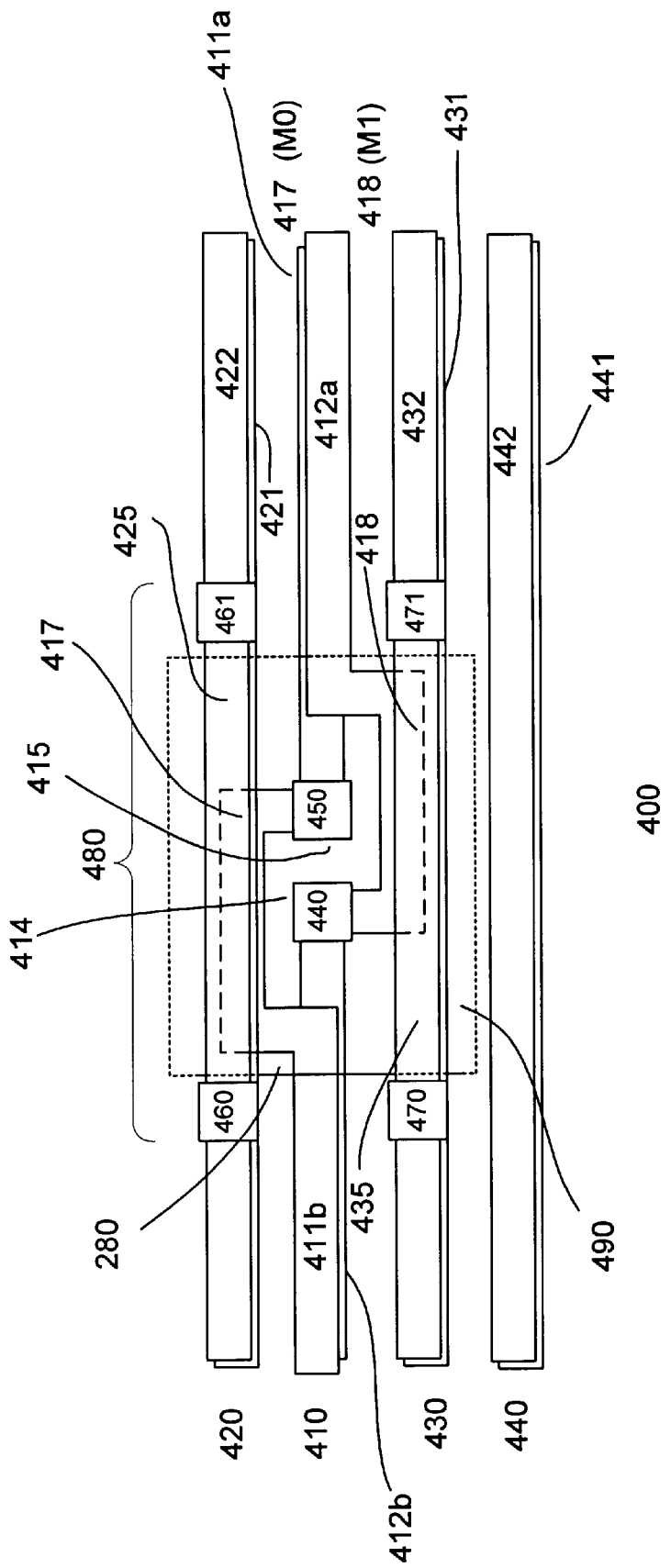
FIGS. 4–7 show embodiments of the invention for reducing the area penalty associated with twists.

FIG. 4 shows a plan view of a portion 400 of a multi-level signal line architecture with vertical twists in accordance with one embodiment of the invention. The portion 400 includes first, second, third, and fourth signal line pairs 410, 420, 430, and 440. The signal line pairs comprise first and second differential signal lines (411 and 412; 421 and 422; 431 and 432; 441 and 442), such as internal differential data lines, differential clock lines, or other types of differential signal lines in an IC. In one embodiment, the signal line pairs comprise bitline pairs having first and second bitlines. Typically, one of the bitlines is referred to as the bitline or bitline true and the other is referred to as the reference or complement bitline.

The bitline pairs comprise bitline paths on a first and second metal or bitline level M0 and M1. The bitlines of a bitline pair occupy both bitline paths (i.e., one or more segments of a bitline are located on both metal levels). Memory cells are coupled to the bitline segments located on the lower bitline level. A twist 280 is used to switch the bitlines from one path to another.

As shown in FIG. 4, the bitline pair 410 includes a first bitline path 417 on M0 and a second bitline path 418 on M1 for bitlines 411 and 412. The first bitline includes first and second segments 411a and 411b. Segment 411a is located in bitline path 417 (M0) and segment 411b is in bitline path 418 (M1). The second bitline includes a first segment 412a (M1) and a second segment 412b (M0). The different segments of a bitline (411a and 411b; 412a and 412b) are coupled via the twist 280.

In one embodiment, the twist 280 comprises first and second twist contacts 440 and 450. A twist contact serves to couple segments of a bitline located on different bitline levels. In one embodiment, the twist contacts are located in alignment with adjacent ends 414 and 415 of the bitline segments 411a and 412b. The bitline segments 411b and 412a each include an offset 417 and 418 on opposite sides of the bitline path. The offset is provided, in one embodiment on M1. The offset enables coupling of the bitline segment on M1 (411b or 412a) to the appropriate contact which is coupled to the other segment of the same bitline (411a or 412b). The first contact (450) couples segments of bitline 411 and the second contact (440) couples segments of bitline 412.

An adjacent bitline pair 420 or 430 may also include one or more twists (not shown) to switch the paths of the bitlines within the bitline pair from one level to another. In one embodiment, the twist or twists of the adjacent bitline pair are not located in the region adjacent to the twist or twists of bitline pair 410.

In accordance with the invention, an open region 480 is provided in the adjacent bitline pair 420. The open region is provided on M1 or the upper bitline level. The open region is adjacent to twist 280 of bitline pair 410. The open region is formed by removing a segment 425 of the bitline 422 on the second level and relocating it to a third metal level (M2). First and second open region contacts 460 an d 461 are provided to couple bitline segment 425 on M2 to bitline 422 o n M1. The open region accommodates the offset of bitline segment 411b. Likewise, adjacent bitline pair 430 comprises an open region 490 to accommodate the offset on bitline segment 412a. A bitline segment 435 located on the third metal level is coupled to bitline 432 via open region contacts 470 and 471. By providing open regions in adjacent bitline pairs which are adjacent to the twist region of the bitline pair 410, a smaller pitch between bitline pairs can be achieved. Thus, the area penalty associated with twists is reduced.

Bitline pair 440, which is located adjacent to bitline pair 430, may include bitline twists and twist regions (not shown). In accordance with one embodiment of the invention, bitline pair does not include twist regions in the same part of the bitline pair as bitline pair 410 (one bitline pair removed) or open regions in the same part of the bitline pair as bitline pair 430 to which it is adjacent. Such an arrangement of bitline pairs can serve as repeatable building blocks to form an array.

Figure 5:
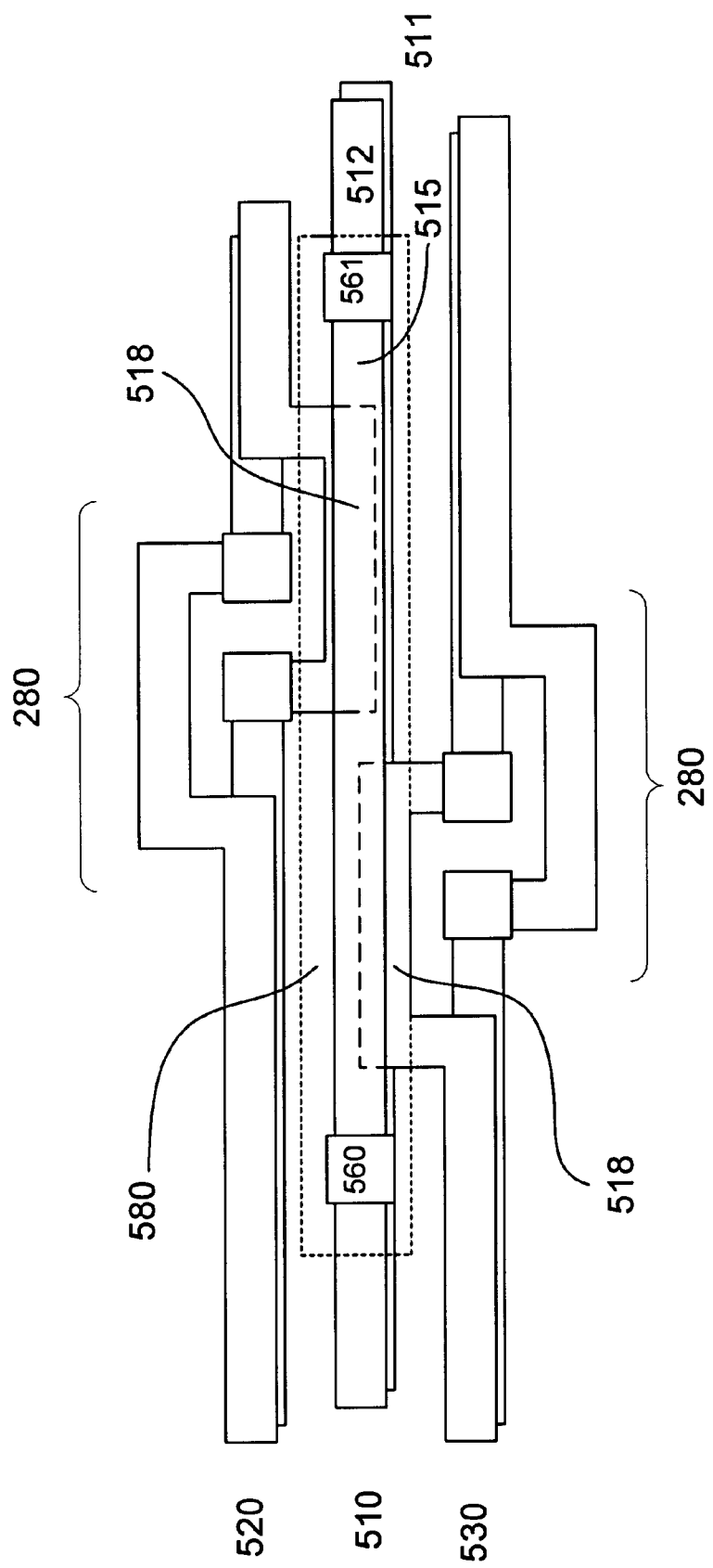

FIG. 5 shows a plan view of a multi-level signal line architecture in accordance with another embodiment of the invention. The portion includes signal line pairs 510, 520, and 530. In one embodiment the signal line pairs comprise bitline pairs. The first bitline pair 510 includes an open region 580 formed by removing a segment 515 of the second bitline 512 on the second bitline or metal level (M1) and locating it on the third metal level (M2). The segment is coupled to the second bitline via first and second contacts 560 and 561. The open region, in accordance with one embodiment of the invention, accommodates offsets 518 from twists of the two adjacent bitline pairs 520 and 530. By providing an open region in a bitline which can accommodate offsets from two twists, adjacent bitlines can be arranged with twists in substantially the same region of the bitline pairs without incurring an area penalty.

Figure 6:
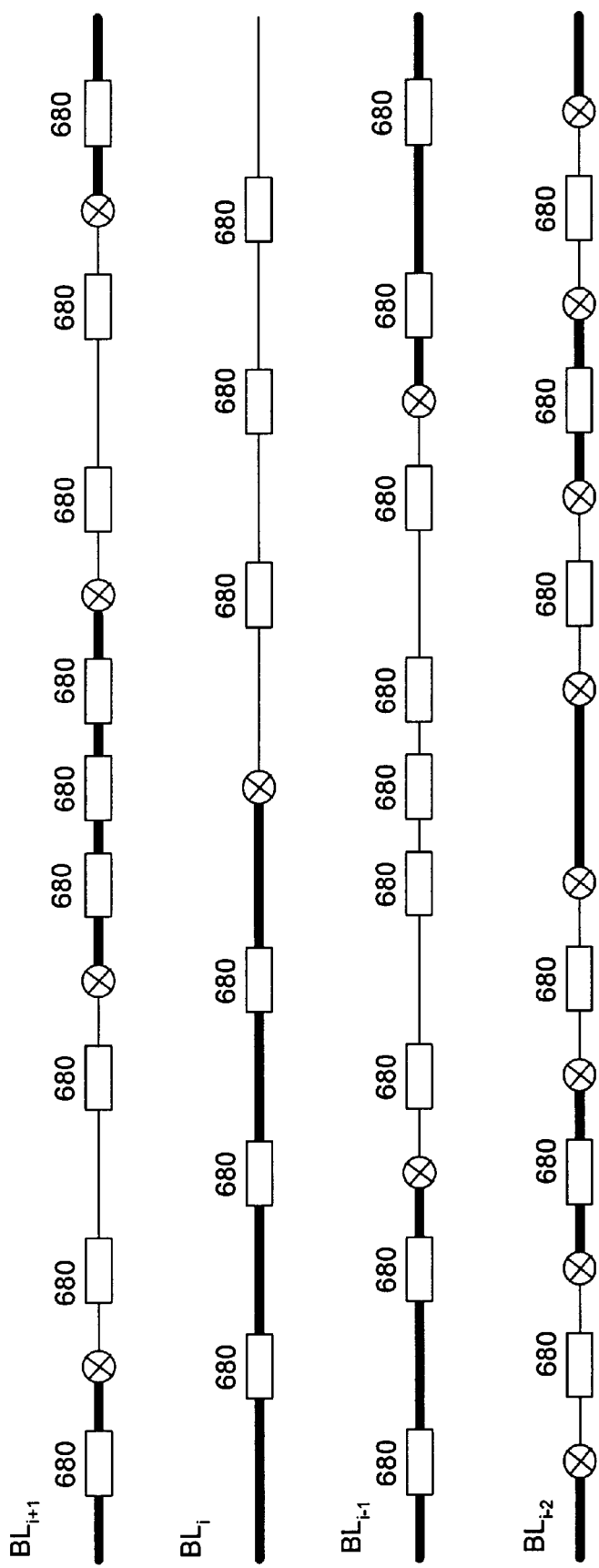

FIG. 6 shows a plan view of a portion of a multi-level signal line architecture in accordance with another embodiment of the invention. The portion includes signal line pairs $BL_i$, $BL_{i-1}$, $BL_{i-2}$, $BL_{i+1}$. In one embodiment, the signal line pairs are bitline pairs. Twists (indicated by a circle with x inside) are provided in the bitline pairs to switch the bitlines from one level to another. The bolded portion of the bitline pair, for example, represents that the first bitline of the pair is on the lower or M0 level and a second bitline is on the upper or M1 level. The unbolded portion represents that the first bitline is on M1 and the second bitline is on M0.

In one embodiment, the twists separate bitlines of a bitline pair into a plurality of segments. The total lengths of the first and second bitline segments along a bitline path are about equal. In one embodiment, the twists are arranged to transform coupling noise between the bitline pairs into common mode noise. This is advantageous since common mode noise does not decrease the magnitude of the differential signal.

In one embodiment, one of the bitline pairs ($BL_i$) is provided with m twists, where m is a whole number $\geq 1$. An adjacent bitline pair ($BL_{i+1}$ or $BL_{i-1}$) comprises n twists, where n is a whole number $\geq 1$ and $\neq$ m. The twists separate the bitlines into a plurality of bitline segments (m+1 or n+1). By providing a different number of twists for adjacent bitline pairs, the twists of any two adjacent bitline pairs are located in different regions of the bitline pair, thus enabling the implementation of an open region 680 to accommodate the twists of an adjacent bitline pair.

In accordance with one embodiment, the bitline pairs $BL_{i-1}$ and $BL_{i+1}$ comprises a different number of twists ($n_{i+1} \neq n_{i-1}$). This ensures that every other bitline pair has twists in different regions of the bitline pair. Thus an open region needs only to accommodate one twist from an adjacent bitline pair. The rules for providing to bitline pairs can be extended to bitline pair $BL_{i-1}$. For example, rules related to adjacent bitline pairs can be applied to $BL_{i-2}$ with respect to $BL_{i-1}$.

In an illustrative embodiment, bitline pair $BL_i$ comprises one twist (m=1), one of the adjacent bitline pairs ($BL_{i+1}$) comprises four twists ($n_{i+1}$=4) and the other adjacent bitline pair ($BL_{i-1}$) comprises 2 twists 538a–b (i.e., $n_{i-1}$=2). Bitline pair $BL_{i-2}$ comprises 8 twists. Open regions are provided in the bitline pair, with each open region accommodating a twist from an adjacent bitline pair. The group of bitline pairs can be, for example, repeated to form an array.

Figure 7:
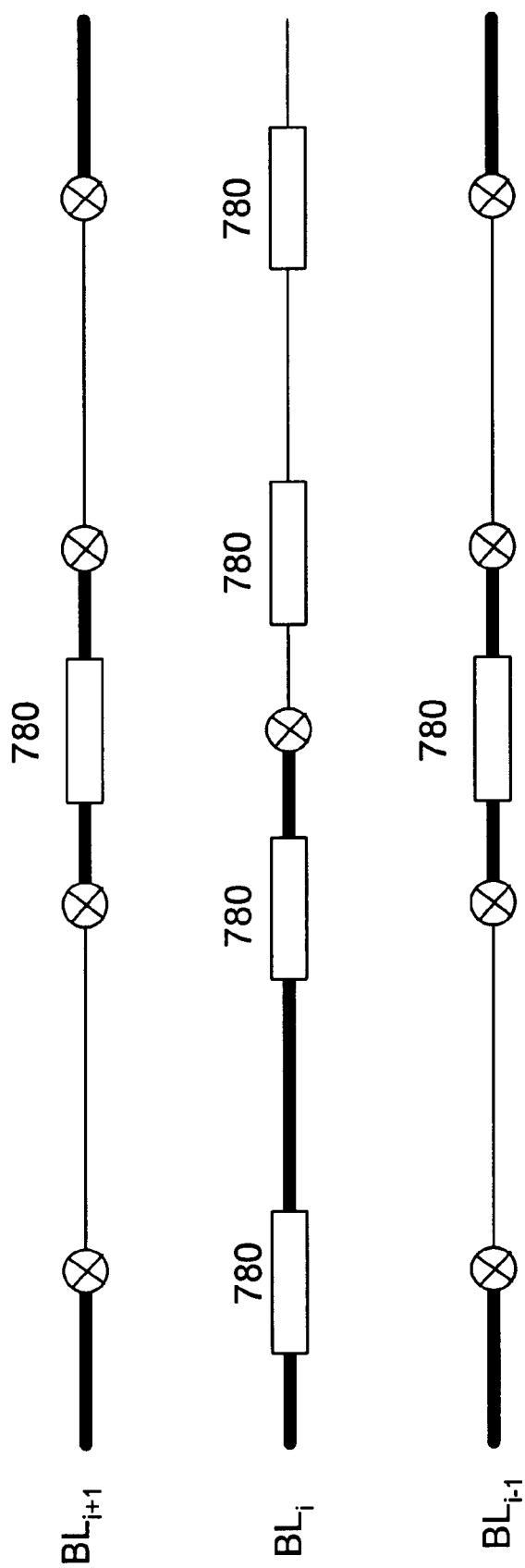

In an alternative embodiment of the invention, as shown in FIG. 7, bitline pairs $BL_{i+1}$ and $BL_{i-1}$, which are adjacent to bitline pair $BL_i$ comprise the same number of twists ($n_{i+1}+n_{i-1}$). As such, an open region 780 in a bitline pair $BL_i$ accommodates two twists, one from each bitine pair to which it is adjacent. Illustratively, bitline pair $BL_i$ comprises 1 twists and adjacent bitline pairs $BL_{i+1}$ and $BL_{i-1}$ comprise 4 twists. The group of bitline pairs can be, for example, repeated to form an array.

While the invention has been particularly shown and described with reference to various embodiments, it will be recognized by those skilled in the art that modifications and changes may be made to the present invention without departing from the spirit and scope thereof. Merely by way of example, the invention can be useful for reducing the adverse impact of coupling noise in any type of differential signal lines. The scope of the invention should therefore be determined not with reference to the above description but with reference to the appended claims along with their full scope of equivalents.

What is claimed is:

1. A multi-level signal line pair comprising:

first and second signal line paths on a first and second signal line level;

first and second signal lines occupying first and second signal line paths;

a vertical twist to switch the first and second signal lines to different signal line paths, the vertical twists including first and second twist contacts, the first twist contact switching the first signal line to different signal line paths and the second twist contact switching the second signal line to different signal line paths, the first signal line includes a first offset to avoid the second contact and the second signal line includes a second offset to avoid the first contact; and an open region in one of the signal lines on the second signal line level to accommodate an offset of a twists in an adjacent signal line pair, the open region comprises a first and second open region contacts, the contacts couple a segment of the one signal line located on a third signal line level to the one signal line.

* * * * *